United States Patent

Horie

Patent Number: 5,928,428
Date of Patent: *Jul. 27, 1999

[54] APPARATUS AND METHOD FOR MANUFACTURING A SEMICONDUCTOR DEVICE

[75] Inventor: Yasuhiko Horie, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/710,242

[22] Filed: Sep. 13, 1996

[30] Foreign Application Priority Data

Feb. 23, 1996 [JP] Japan ................. 8-036134

[51] Int. Cl.$^6$ ................. C23C 16/00
[52] U.S. Cl. ............. 118/724; 118/715; 118/725
[58] Field of Search ................. 118/715, 725, 118/724; 437/238

[56] References Cited

U.S. PATENT DOCUMENTS

| | | | |
|---|---|---|---|
| 4,124,467 | 11/1978 | Pincon | 250/527 |
| 4,608,063 | 8/1986 | Kurokawa | 118/728 |
| 5,000,113 | 3/1991 | Wang | 118/725 |
| 5,462,899 | 10/1995 | Ikeda | 437/238 |
| 5,484,749 | 1/1996 | Maeda | 437/238 |
| 5,500,256 | 3/1996 | Watabe | 437/238 |

FOREIGN PATENT DOCUMENTS

| | | |
|---|---|---|
| 60-1827 | 1/1985 | Japan . |
| 63-291893 | 11/1988 | Japan . |
| 2-125876 | 5/1990 | Japan . |
| 2-268433 | 11/1990 | Japan . |
| 2-303130 | 12/1990 | Japan . |
| 5-299523 | 11/1993 | Japan . |
| 6-283521 | 10/1994 | Japan . |

*Primary Examiner*—Richard Bueker
*Attorney, Agent, or Firm*—Oblon, Spivak, McClelland, Maier & Neustadt, P.C.

[57] ABSTRACT

Apparatus and method for manufacturing a semiconductor device in which silicon oxide films are formed using TEOS gas. Thereafter, oxygen gas containing ozone or oxygen radicals is introduced to a chamber and exhausted through a heated exhaust pipe. The stability of thickness of the silicon oxide films are enhanced.

5 Claims, 6 Drawing Sheets

METHOD OF $SiO_2$ FILM FORMATION

APPARATUS AND METHOD FOR MANUFACTURING A SEMICONDUCTOR DEVICE

BACKGROUND OF THE INVENTION

1. Field of the Invention

The present invention relates generally to an apparatus and a method for manufacturing semiconductor devices, and specifically to an apparatus and a method for forming silicon oxide films.

2. Discussion of the Background

In the conventional method for manufacturing a semiconductor device, TEOS gas has widely been used for forming silicon oxide films. In these methods, silicon wafers are placed in a quartz chamber which has been heated to about 700° C., and TEOS gas is introduced into the quartz chamber to form silicon oxide films on the surface of the silicon wafers by thermal decomposition. TEOS is the abbreviation of tetraethyl ortho-silicate, represented by the chemical formula, $Si(OC_2H_5)_4$.

Referring to drawings, FIG. 3 is a schematic diagram illustrating the construction of a conventional semiconductor manufacturing apparatus for forming silicon oxide ($SiO_2$) films. Specifically, this is a reduced pressure CVD apparatus for forming silicon oxide films. As FIG. 3 shows, this manufacturing apparatus comprises a quartz chamber 1, and a heater 2 for heating the quartz chamber 1. The quartz chamber 1 accommodates silicon wafers 3 and a quartz boat 4 on which the silicon wafers are placed. The quartz chamber 1 is connected to a TEOS gas supply source and a nitrogen gas supply source through pneumatic valves 5a, 5b and mass flow controllers 6a, 6b, respectively. An exhaust pipe 7, a main valve 8a, a sub-valve 8b and a vacuum pump 9 are also connected to the quartz chamber 1.

FIG. 4 is a flow diagram showing a conventional method for forming silicon oxide films when silicon oxide films are formed using the manufacturing apparatus described above.

Referring to FIGS. 3 and 4, the conventional method of forming silicon oxide films will be described. First, a boat 4 holding silicon wafers 3 is loaded into a quartz chamber 1 under atmospheric pressure. The valve 5b for introducing nitrogen gas ($N_2$) is opened, and nitrogen gas is introduced into the quartz chamber 1 at a flow rate of 2 l/min (liter per minute) through a mass flow controller 6b for controlling the flow rate (see FIG. 4, step F11, Boat load).

Next, the flow rate of nitrogen gas is adjusted to 200 cc/min using the mass flow controller 6b for adjusting the flow rate of nitrogen gas, and the sub-valve 8b for exhausting is opened to evacuate the quartz chamber 1 slowly. When the pressure in the chamber 1 has been lowered to 266 Pa (20 Torr) or less, the valve 5b for introducing nitrogen gas is closed, and the evacuation is continued until the pressure reaches 133 Pa (1 Torr) or less. Thereafter, the main valve 8a for exhausting is opened, and evacuation is further continued until the pressure is lowered to $133 \times 10^{-3}$ Pa ($1 \times 10^{-3}$ Torr) or less (see FIG. 4, step F12, Evacuation).

Then, the sub-valve 8b and the main valve 8a for exhausting are closed, the pressure in the quartz chamber 1 is maintained, and leakage is checked. When the pressure in the chamber stays at 13.3 Pa (0.1 Torr) or less, leakage is deemed not to occur, and the sub-valve 8b and the main valve 8a are opened again to evacuate the quartz chamber 1 (see FIG. 4, step F13, Leakage check).

Next, the valve 5a for introducing TEOS gas is opened, and the flow rate of TEOS gas is adjusted to 100 cc/min. using the mass flow controller 6a to introduce the TEOS gas into the quartz chamber 1. The quartz chamber 1 is maintained at a pressure of 173 Pa (1.3 Torr) and a temperature of 670° C. during oxide film formation (see FIG. 4, step F14, TEOS introduction and film formation).

After the oxide film has been formed, the valve 5a for introducing TEOS gas is closed, and the valve 5b for introducing nitrogen gas is opened to purge the gas in the quartz chamber 1 with nitrogen gas (see FIG. 4, step F15, $N_2$ introduction).

After the completion of purging the TEOS gas, the flow rate of nitrogen gas is adjusted to 500 cc/min. using the mass flow controller 6b for adjusting the flow rate of nitrogen gas. The main valve 8a for exhausting is closed, and the pressure in the quartz chamber 1 is adjusted to about 665 Pa (5 Torr).

Next the sub-valve 8b is closed to adjust the pressure of the nitrogen gas to about 3990 Pa (30 Torr). Thereafter, the setting of the mass flow controller 6b is slowly raised to return the pressure of the nitrogen gas to normal pressure (see FIG. 4, step F16, Returning to Atmospheric pressure).

Finally, the boat 4 is unloaded from the quartz chamber 1 (see FIG. 4, step F17, Boat unloading).

In the conventional apparatus and method for forming silicon oxide films on semiconductor devices as described above, the majority of TEOS gas introduced reaches the vacuum exhaust pipe 7 without being completely decomposed thermally, and deposits are formed in the pipe 7. These deposits cause out-gassing during the formation of the silicon oxide films, which in turn forms particles and deposits on the surface of the silicon wafer, lowering the reliability of the products.

Referring to the drawings, in the semiconductor manufacturing apparatus of FIG. 3, the majority of TEOS gas introduced into the chamber 1 reaches the vacuum exhaust pipe 7 without being completely decomposed, where it is cooled and the deposits are formed as shown in FIG. 5.

In the silicon oxide film forming process, nitrogen gas is introduced after film formation for a specified time, to return the chamber to normal pressure, as shown in FIG. 6(a). At this time, pressure in the chamber 1 rises to a little higher than the atmospheric pressure. Therefore, in the following boat unloading process, a back flow of the gas from the vacuum exhaust pipe 7 towards the quartz chamber 1 is caused, as shown in FIG. 6(b). At this time, fine particles or out-gassing from the deposits which have not yet reacted reach the quartz chamber 1 and form particles. In order to decrease the formation of the particles, therefore, it is necessary that the non-reacted gas will not easily deposit in the exhaust pipe 7, and that the generation of fine particles or out-gassing is decreased by lowering the amount of the non-reacted gas.

SUMMARY OF THE INVENTION

The object of the present invention is to solve the problems in such a conventional apparatus and method for manufacturing a semiconductor device, that is, to solve the problem of the formation of particles during the formation of silicon oxide films, and to solve the problem of the instability of the thickness of the film formed. The present invention will provide an apparatus and method for manufacturing a semiconductor device which minimizes the abnormality in the process during film formation, and realizes stable film formation.

According to one aspect of the present invention, an apparatus for manufacturing a semiconductor device comprises a chamber for accommodating semiconductor wafers, and a nitrogen gas supply means for supplying nitrogen gas to said chamber. A TEOS gas supply means is provided for supplying TEOS gas to said chamber, and an oxygen-based gas supply means is provided for supplying oxygen-based gas to said chamber. A switching means is provided for switching gases supplied to said chamber, and an exhaust pipe provided for exhausting gas from said chamber.

According to another aspect of the present invention, the apparatus for manufacturing a semiconductor device further comprises a heater for heating the exhaust pipe to a constant temperature.

According to another aspect of the present invention, the apparatus for manufacturing a semiconductor device further comprises a heater for heating the exhaust pipe to a temperature range between 150° C. and 500° C.

In another aspect of the present invention, the apparatus for manufacturing a semiconductor device further comprises an ozone generator in the oxygen-based gas supply means.

In another aspect of the present invention, the apparatus for manufacturing a semiconductor device further comprises an ultraviolet ray irradiation means for irradiating the oxygen-based gas with ultraviolet rays.

In another aspect of the present invention, in the apparatus for manufacturing a semiconductor device, one of oxygen gas, ozone, oxygen radicals, or a mixture of any of such gases is supplied as the oxygen-based gas.

Further, according to another aspect of the present invention, in the method for manufacturing a semiconductor device, nitrogen gas is supplied into the chamber accommodating semiconductor wafers, and then TEOS gas is supplied into said chamber for causing a reaction. Then, the TEOS gas is exhausted from the chamber through the exhaust pipe while the TEOS gas is being supplied into the chamber. Thereafter, an oxygen-based gas is supplied into the chamber and exhausted through the exhaust pipe.

According to another aspect of the present invention, in the method for manufacturing a semiconductor device, the exhaust pipe is heated to a constant high temperature, and the oxygen-based gas is supplied into the chamber and exhausted through the heated exhaust pipe.

According to still another aspect of the present invention, in the method for manufacturing a semiconductor device, the exhaust pipe is heated to a temperature range between 150° C. and 500° C., and the oxygen-based gas is supplied into the chamber and exhausted through the exhaust pipe.

In another aspect of the present invention, in the method for manufacturing a semiconductor device, one of oxygen gas, ozone, oxygen radicals, or a mixture of any of such gases is supplied as the oxygen-based gas.

BRIEF DESCRIPTION OF THE DRAWINGS

A more complete appreciation of the invention and many of the attendant advantages thereof will be readily obtained as the same becomes better understood by reference to the following detailed description when considered in connection with the drawings, wherein.

DESCRIPTION OF THE PREFERRED EMBODIMENTS

Figure 1:
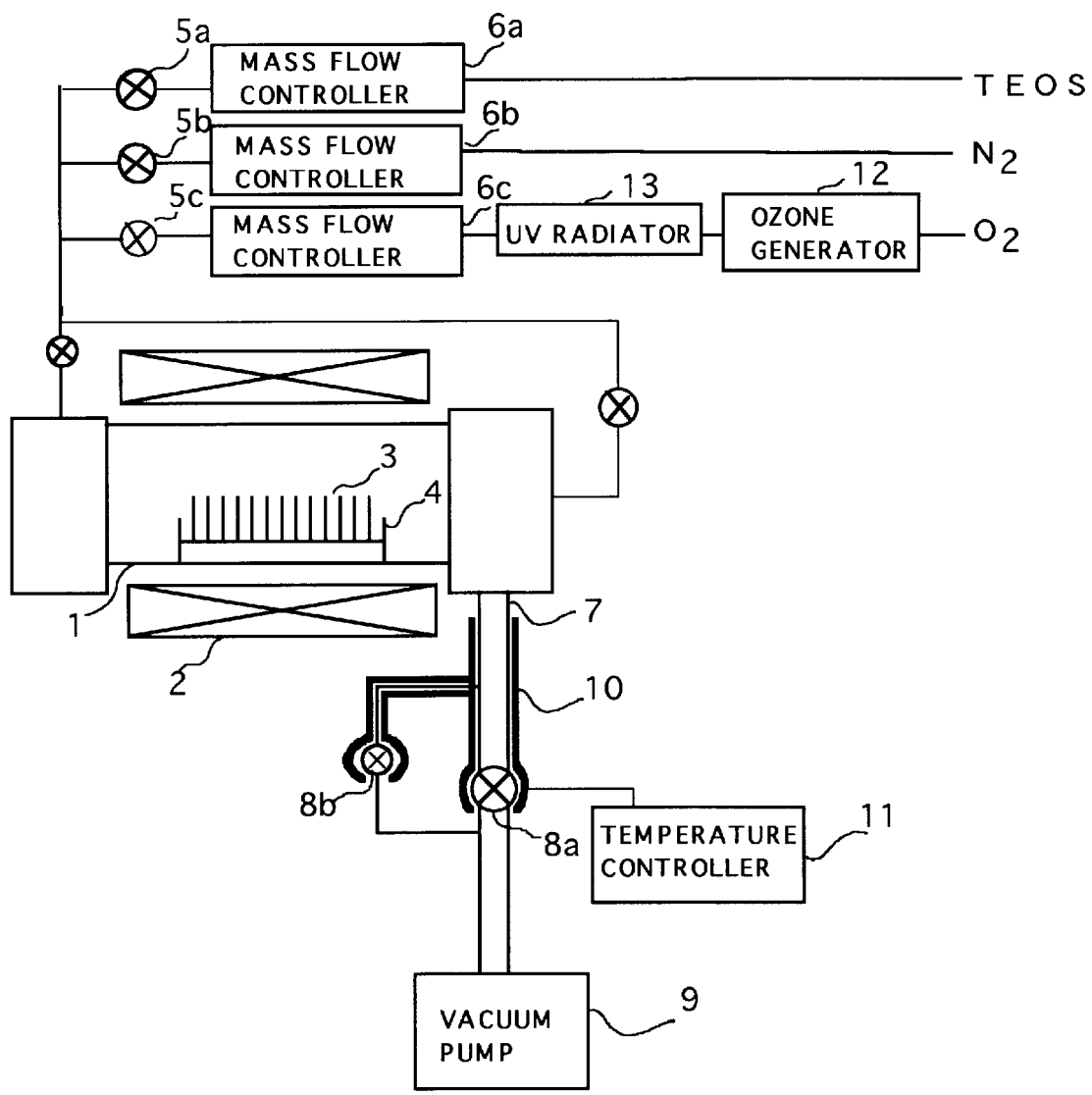
FIG. 1 is a schematic diagram illustrating an apparatus for manufacturing a semiconductor device according to the present invention.

This invention will be described in further detail with reference to the accompanying drawings. FIG. 1 is a schematic diagram illustrating the construction of an apparatus for manufacturing a semiconductor device according to the present invention. Specifically, it is a reduced pressure CVD apparatus for manufacturing silicon oxide films. More specifically, it is a reduced pressure CVD apparatus for forming silicon oxide films comprising an oxygen gas supply and a vacuum exhaust pipe heater for decreasing deposits on the vacuum exhaust pipe.

As shown in FIG. 1, the apparatus for manufacturing a semiconductor device according to this embodiment comprises a quartz chamber 1, and a heater 2 for heating the quartz chamber 1. In the quartz chamber 1 are silicon wafers 3 placed on a boat 4. The quartz chamber 1 is connected to the TEOS gas supply source and the nitrogen gas ($N_2$) supply source through pneumatic valves 5$a$ and 5$b$, and mass flow controllers 6$a$ and 6$b$, respectively. The quartz chamber 1 is further connected to an oxygen-based gas supply source via a pneumatic valve 5$c$, a mass flow controller 6$c$, an ozone generator 12, and an ultraviolet radiator 13. Furthermore, a vacuum pump 9 is connected to the downstream side of the quartz chamber 1 via a vacuum exhaust pipe 7, a main valve 8$a$, and sub-valve 8$b$. The vacuum exhaust pipe 7 is provided with a heater 10 for heating and a temperature controller 11 for controlling the temperature of the heater 10.

The pneumatic valve 5$a$ and the mass flow controller 6$a$ are connected to the TEOS gas supply source, and these serve as a TEOS gas supply means. The pneumatic valve 5$b$ and the mass flow controller 6$b$ are connected to the nitrogen gas supply source, and these serve as a nitrogen gas supply means. The pneumatic valve 5$c$, the mass flow controller 6$c$, the ozone generator 12, and the ultraviolet radiator 13 are connected to the oxygen-based gas source, and these serve as an oxygen-based gas supply means. In turn, the pneumatic valves 5$a$, 5$b$ and 5$c$ constitute a switching means for switching gases introduced into the quartz chamber 1.

Figure 2:
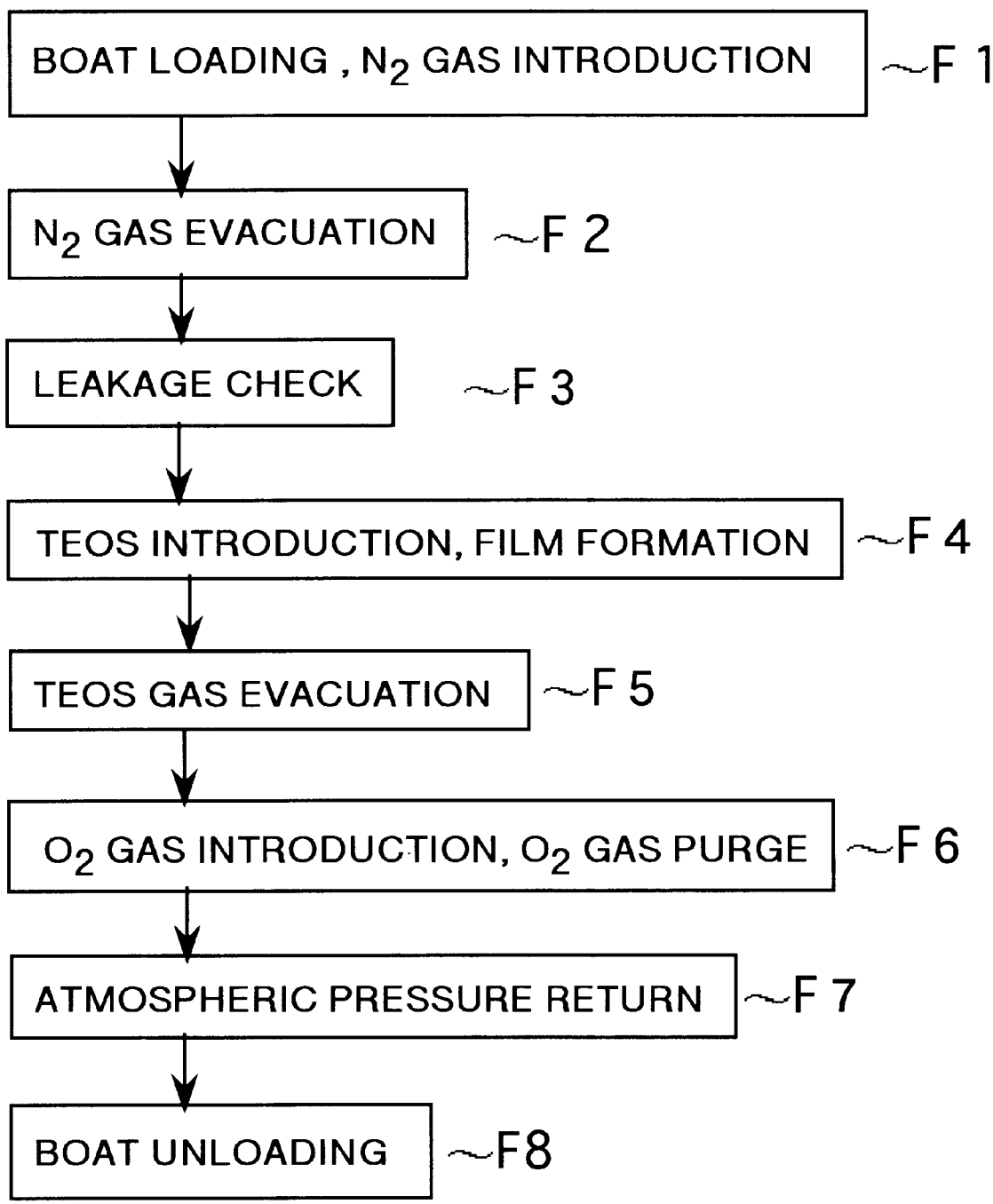
FIG. 2 is a flow diagram of a method for manufacturing a semiconductor device according to the present invention.
Figure 3:
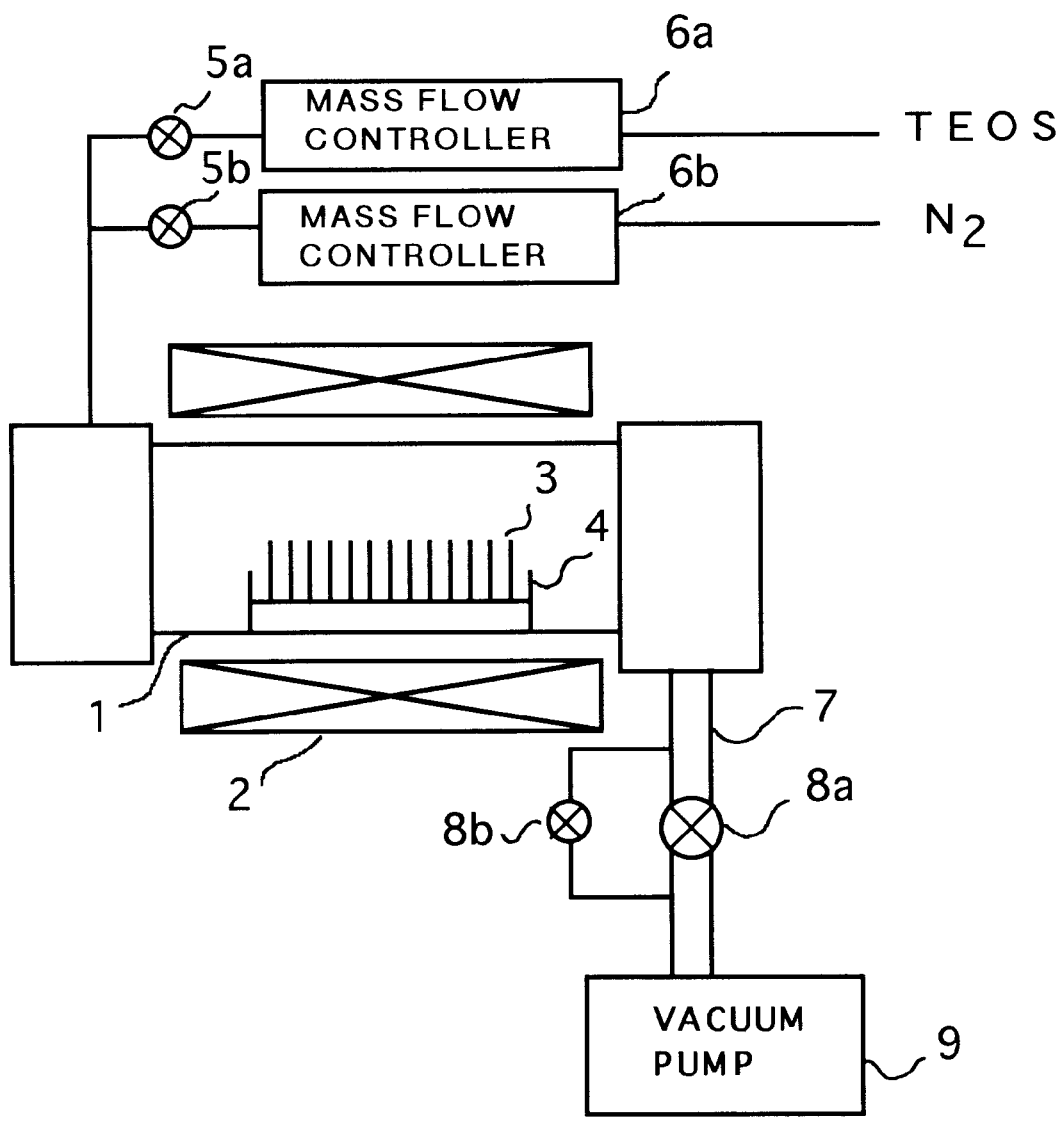
FIG. 3 is a schematic diagram illustrating a conventional apparatus for manufacturing a semiconductor device.
Figure 4:
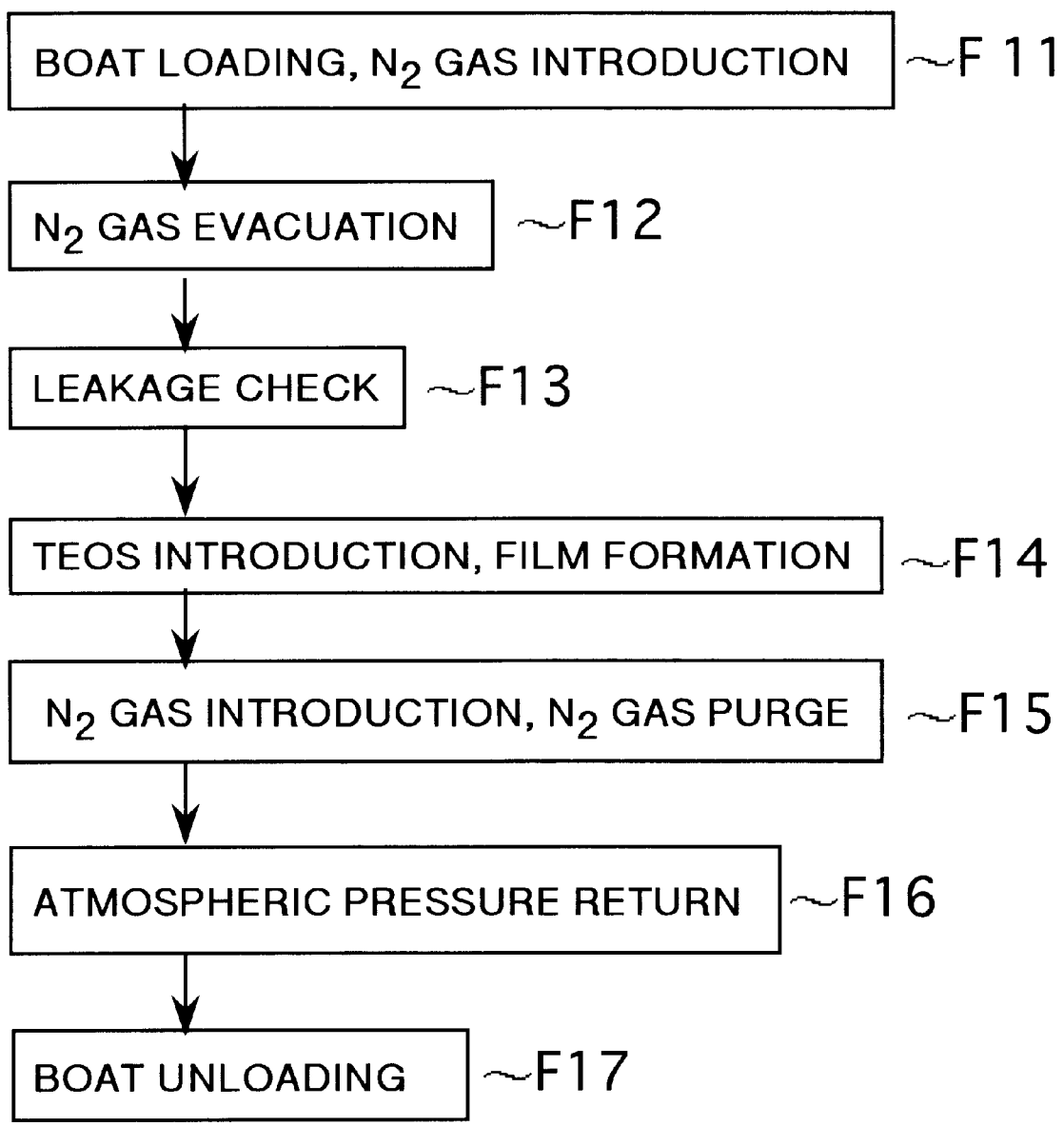
FIG. 4 is a flow diagram of a conventional method for manufacturing a semiconductor device.
Figure 5:
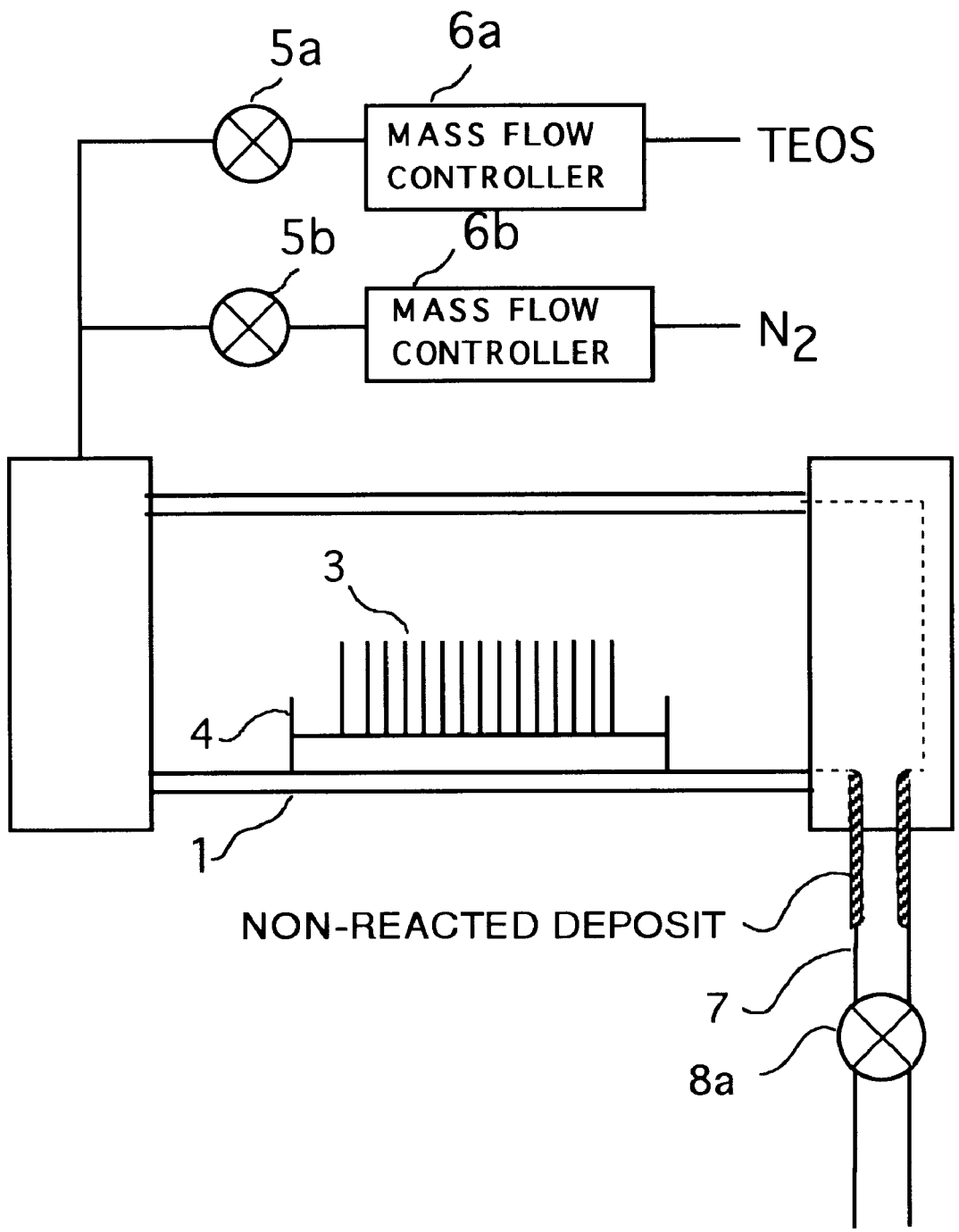
FIG. 5 is a diagram for explaining a conventional apparatus and method for manufacturing a semiconductor device.
Figure 6A:
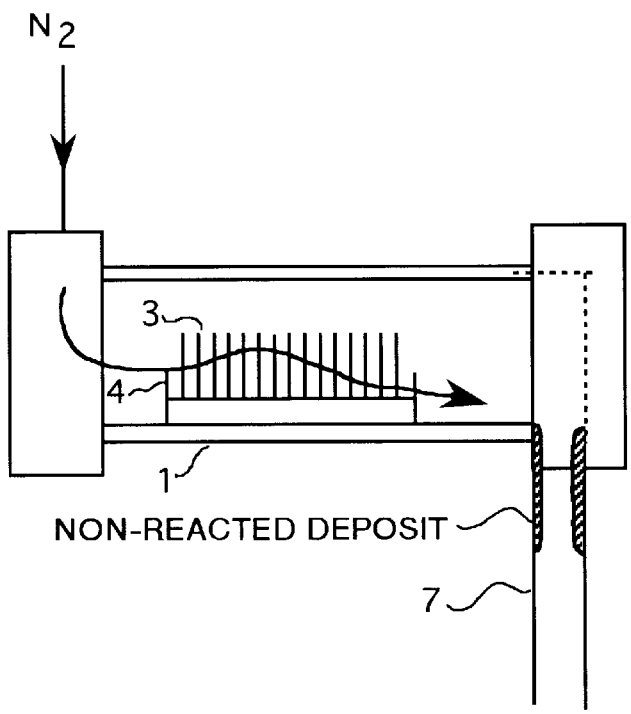
FIG. 6($a$) and FIG. 6($b$) are diagrams for explaining a conventional apparatus and method for manufacturing a semiconductor device.
Figure 6B:
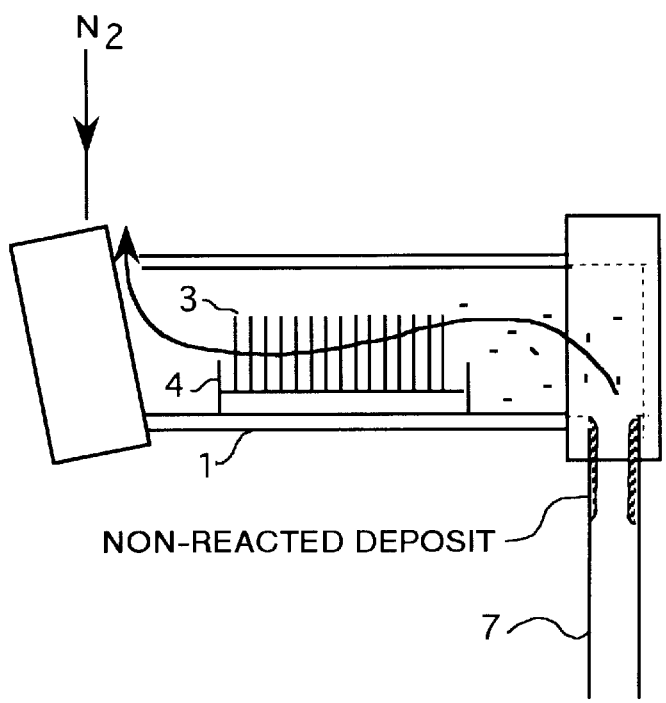

FIG. 2 is a diagram illustrating a method for manufacturing a semiconductor device according to the present invention. This is a chart showing the method of forming a silicon oxide ($SiO_2$) film using an apparatus for manufacturing a semiconductor device of this invention. Referring to FIGS. 1 and 2, the method of forming a silicon oxide film will be described.

Step 1: Boat loading, $N_2$ gas introduction (FIG. 2, Step F1)

The boat 4 carrying silicon wafers 3 is loaded into the quartz chamber 1 under atmospheric pressure. At this time, the valve 5$b$ for introducing nitrogen ($N_2$) gas is opened, and nitrogen gas is introduced into the quartz chamber 1 at a flow rate of 2 l/min (liters per minute) adjusted by the mass flow controller 6$b$ for adjusting the flow rate.

Step 2: Nitrogen gas evacuation (FIG. 2, Step F2)

First, the flow rate of nitrogen gas is reduced to 200 cc/min by the mass flow controller 6$b$ for adjusting the flow rate of nitrogen gas, then, the sub-valve 8$b$ for exhausting is opened, and the quartz chamber 1 is slowly evacuated. When the pressure in the chamber 1 is reduced to 266 Pa (20 Torr) or less, the valve 5b for introducing nitrogen gas is closed, and evacuation is continued until the pressure is lowered to 133 Pa (1 Torr) or less. Then, the main valve 8a for exhausting is opened, and evacuation is further continued until the pressure is lowered to $133 \times 10^{-3}$ Pa ($1 \times 10^{-3}$ Torr) or less.

Step 3: Leakage check (FIG. 2, Step F3)

The sub-exhausting valve 8b and the main exhausting valve 8a are closed, and the quartz chamber 1 is maintained in vacuum, and leakage is checked. If the pressure in the chamber 1 is maintained at 13.3 Pa (0.1 Torr) or less, it is deemed that the chamber 1 does not leak. Then, the sub-valve 8b and the main valve 8a are opened again to evacuate the quartz chamber 1.

Step 4: TEOS introduction and film formation (FIG. 2, Step F4)

The valve 5a for introducing TEOS gas is opened, and TEOS gas is introduced into the quartz chamber 1 at a flow rate of 100 cc/min. (cc per minute) under conditions of a temperature of 670° C. and a pressure of 173 Pa (1.3 Torr) adjusted by the mass flow controller 6a for adjusting the flow rate of TEOS gas. Thereby, a silicon oxide film is formed on the surface of silicon wafers 3.

For forming the oxide film, gases other than TEOS, such as a polymer of TEOS, e.g. OMTCS (octamethyl-tetrasiloxane, $Si_4O_4(CH_3)_8$), may be used.

Step 5: TEOS gas evacuation (FIG. 2, Step F5)

The valve 5a is closed to stop supplying TEOS gas, then the quartz chamber 1 is evacuated to $133 \times 10^{-3}$ Pa ($1 \times 10^{-3}$ Torr) or less.

Step 6: Oxygen gas introduction—oxygen gas purge (FIG. 2, Step F6)

Next, the valve 5c for introducing oxygen-based gas is opened to introduce oxygen gas ($O_2$), ozone ($O_3$), or other oxygen radicals (herein, collectively called oxygen-based gas), and at the same time, exhaust valves 8a and 8b are opened to exhaust the gas through the exhaust pipe 7. At this time, in the oxygen-based gas supply means, the ozone generator 12 is utilized to generate ozone, and the ultraviolet light radiator 13 is used to accelerate the generation of ozone or oxygen radicals (active oxygen).

While oxygen-based gas is allowed to flow, the vacuum exhaust pipe 7 is maintained at a constant temperature between 150° C. and 500° C. by the temperature controller 11 and heater 10.

Step 7: Atmospheric pressure returning of oxygen gas (FIG. 2, Step F7)

First, the flow rate of oxygen gas is adjusted to 500 cc/min by the mass flow controller 6c for adjusting the flow rate of oxygen gas, and the main exhausting valve 8a is closed to make the pressure in the quartz chamber 1 to be about 665 Pa (5 Torr). Then, the sub-exhausting valve 8b is closed to make the pressure in the chamber about 3990 Pa (30 Torr). Then, the setting of the mass flow controller 6c is slowly increased to return the pressure in the chamber 1 to atmospheric pressure.

Step 8: Boat unloading (wafer unloading) (FIG. 2, Step F8)

When the pressure of oxygen-based gas has returned to atmospheric pressure, the quartz boat 4 is unloaded.

In this case, the vacuum exhaust pipe 7 is maintained at a constant temperature between 150° C. and 500° C. by the temperature controller 11. The result of an experiment showed that the heating of the vacuum exhaust pipe 7 for avoiding the deposit of non-reacted gas had a large effect at 150° C. or above, significantly at 200° C. or above, indicating that the mass of the gas, which had not reacted yet, decreased markedly with a rise in heating temperature. However, heating up to 500° C. is sufficient, and higher temperatures are not required.

Thus, the vacuum exhaust pipe 7 is heated to a high temperature throughout the process, and the chamber 1 is evacuated while oxygen-based gas is flowing. Thereby, the oxidation of TEOS gas, which is deposited in the exhaust vacuum pipe 7 without reacting, is accelerated and their mass decreases, and their composition approaches to a silicon oxide ($SiO_2$) film. Therefore, fine particles and out-gassing generated from the non-reacted gas decrease. As a result, the amount of particles which deposit on the silicon wafers 3 decreases, and the reproducibility of thickness of the formed silicon oxide film is improved.

Next, the composition change of the non-reacted gas caused by ozone during this process will be described in a little more detail. First, the chemical reaction when TEOS is thermally decomposed is as follows:

$$Si(OC_2H_5)_4 \rightarrow SiO_2 + 4C_2H_4 + 2H_2O\uparrow$$

In the actual apparatus, however, this reaction does not completely take place, and some products, represented for example by a composition formula of $SiC_{0.90}H_{3.62}O_{3.30}$ or $SiC_{0.53}H_{1.98}O_{2.75}$ are produced. These products are considered to have bonds such as —OH— and —CH—.

On the other hand, ozone produces $O_2$ and $O^*$ (oxygen radical) as follows:

$$O_3 \rightarrow O_2 + O^*$$

Since $O_2$ oxidizes TEOS as indicated in the following equation, it is considered that the same oxidation reaction is caused to the non-reacted gas, and their composition approaches $SiO_2$.

$$Si(OC_2H_5)_4 + mO_2 \rightarrow SiO_2 + pCO_2\uparrow + qH_2O \uparrow \qquad (1)$$

Also, since the oxygen radical $O^*$ is a stronger oxidant, the reaction of equation (1) is more accelerated. By thus making the composition of the non-reacted products approach $SiO_2$, the mass of the non-reacted gas decreases, and the formation of fine particles and out-gassing are reduced, so that the formation of particles is considered to be restrained.

As described above, according to the apparatus and method for manufacturing a semiconductor device of the present invention, an apparatus for manufacturing a semiconductor device having stable film thickness is provided by minimizing the production of deposits (i.e. particles) during the formation of silicon oxide films. And a method for manufacturing a semiconductor device having stable film thickness is provided by decreasing abnormalities during film processing, and by minimizing the production of deposits (i.e. particles).

It is further understood that the foregoing description is a preferred embodiment of the disclosed apparatus and that various changes and modifications may be made in the invention without departing from the spirit and scope thereof.

What is claimed as new and desired to be secured by Letters Patent of the United States is:

1. An apparatus for manufacturing a semiconductor device comprising:

a chamber for accommodating semiconductor wafers, a nitrogen gas supply means for supplying nitrogen gas to said chamber, a TEOS gas supply means for supplying TEOS gas to said chamber, an oxygen-based purge gas supply means for supplying oxygen-based purge gas to said chamber;

a switching means for switching gases supplied to said chamber, an exhaust pipe for exhausting gas from said chamber, and means for accelerating oxidation of the deposit of non-reacted TEOS gas in said exhaust pipe, a controller for controlling the temperature of said means for accelerating oxidation so that said means for accelerating oxidation is heated when said switching means supplies only said oxygen-based purge gas to said chamber.

2. An apparatus for manufacturing a semiconductor device according to claim 1, wherein said oxygen-based gas is selected from a group consisting of oxygen gas, ozone gas, oxygen radicals, or a mixture of any of such gases.

3. The apparatus for manufacturing a semiconductor device according to claim 1, wherein said means for accelerating heats said exhaust pipe to a temperature range between 150° C. and 500° C.

4. An apparatus for manufacturing a semiconductor device according to claim 1, further comprising an ozone generator in said oxygen-based purge gas supply means.

5. An apparatus for manufacturing a semiconductor device according to claim 1, further comprising, in said oxygen-based purge gas supply means, an ultraviolet ray irradiation means for irradiating said oxygen-based gas with ultraviolet rays.

* * * * *